United States Patent [19]
Murano

[11] Patent Number: 5,173,759
[45] Date of Patent: Dec. 22, 1992

[54] ARRAY OF LIGHT EMITTING DEVICES OR PHOTO DETECTORS WITH MARKER REGIONS

[75] Inventor: Shunji Murano, Aira, Japan

[73] Assignee: Kyocera Corporation, Kyoto, Japan

[21] Appl. No.: 651,328

[22] Filed: Feb. 5, 1991

[30] Foreign Application Priority Data

| Feb. 6, 1990 | [JP] | Japan | 2-27810 |
| Jun. 30, 1990 | [JP] | Japan | 2-173795 |
| Aug. 21, 1990 | [JP] | Japan | 2-220821 |

[51] Int. Cl.$^5$ ............................................. H01L 27/14
[52] U.S. Cl. ....................................... 257/88; 257/92; 257/93; 257/443; 257/918; 257/797; 257/446; 346/107 R; 313/512; 362/800; 359/53
[58] Field of Search ............... 357/45, 32, 17, 30 H, 357/30 P, 31, 30 L, 30 M, 30 G; 250/211 J, 211 R, 578.1; 350/334, 335; 355/67, 70, 3 R; 346/107 R, 160, 1.1; 313/500, 512; 362/800, 252; 359/62, 53, 54

[56] References Cited

U.S. PATENT DOCUMENTS

| 3,654,476 | 4/1972 | Hakki | 352/32 X |
| 4,376,282 | 3/1983 | Kotani et al. | 346/107 R |
| 4,509,826 | 4/1985 | Aragi | 350/286 |
| 4,805,006 | 2/1989 | Yamaguchi et al. | 357/32 X |
| 5,017,987 | 5/1991 | Nanjoh et al. | 357/30 H |

FOREIGN PATENT DOCUMENTS

| 0173413 | 3/1986 | European Pat. Off. | 357/30 H |
| 63-30271 | 2/1988 | Japan. | |
| 2210500 | 6/1989 | United Kingdom. | |

Primary Examiner—William Mintel
Attorney, Agent, or Firm—Spensley Horn Jubas & Lubitz

[57] ABSTRACT

In an optical printer head or image reading apparatus, light emitting diodes, photo detectors and other picture elements are formed, by a specified number of pieces individually, as picture element arrays, and these arrays are linearly arranged. The distance of the picture elements at the adjacent outermost positions of the arrays, that is, the distance between the arrays, and the position of the heightwise direction of the arrays must be composed to be identical. Accordingly, the positioning marks are formed in the arrays in the same manufacturing process of the picture elements, and the distance between the arrays is adjusted at high precision. The arrays are affixed to the wiring substrate with an adhesive, and at this time by adjusting the layer thickness of the adhesive, the positions in the heightwise direction of the array surface are identically controlled. This job is done by adjusting the relative positions of the arrays to be mounted and the wiring substrate, while monitoring the wiring substrate on which the arrays are mounted, by a television camera or the like from the array side surface.

6 Claims, 16 Drawing Sheets

Fig. 2 Prior Art
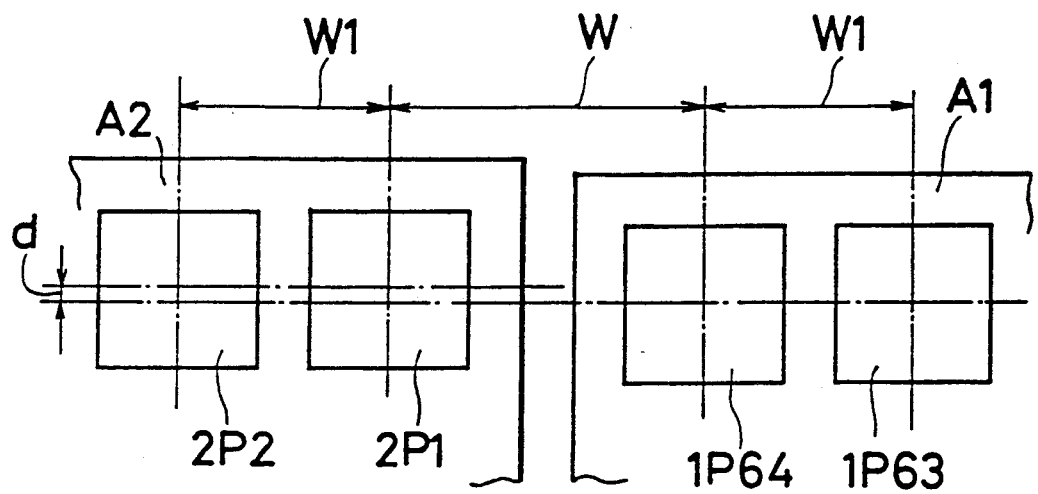
Prior Art
Fig. 3 (1)
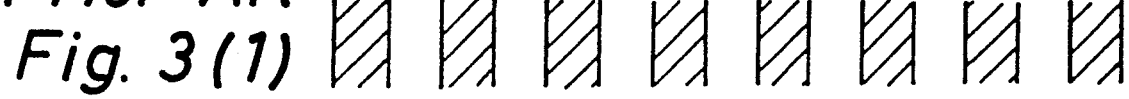
Prior Art
Fig. 3 (2)
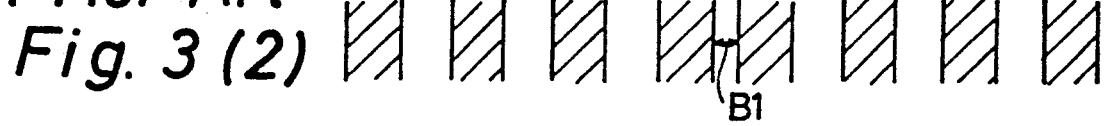
Prior Art
Fig. 3 (3)

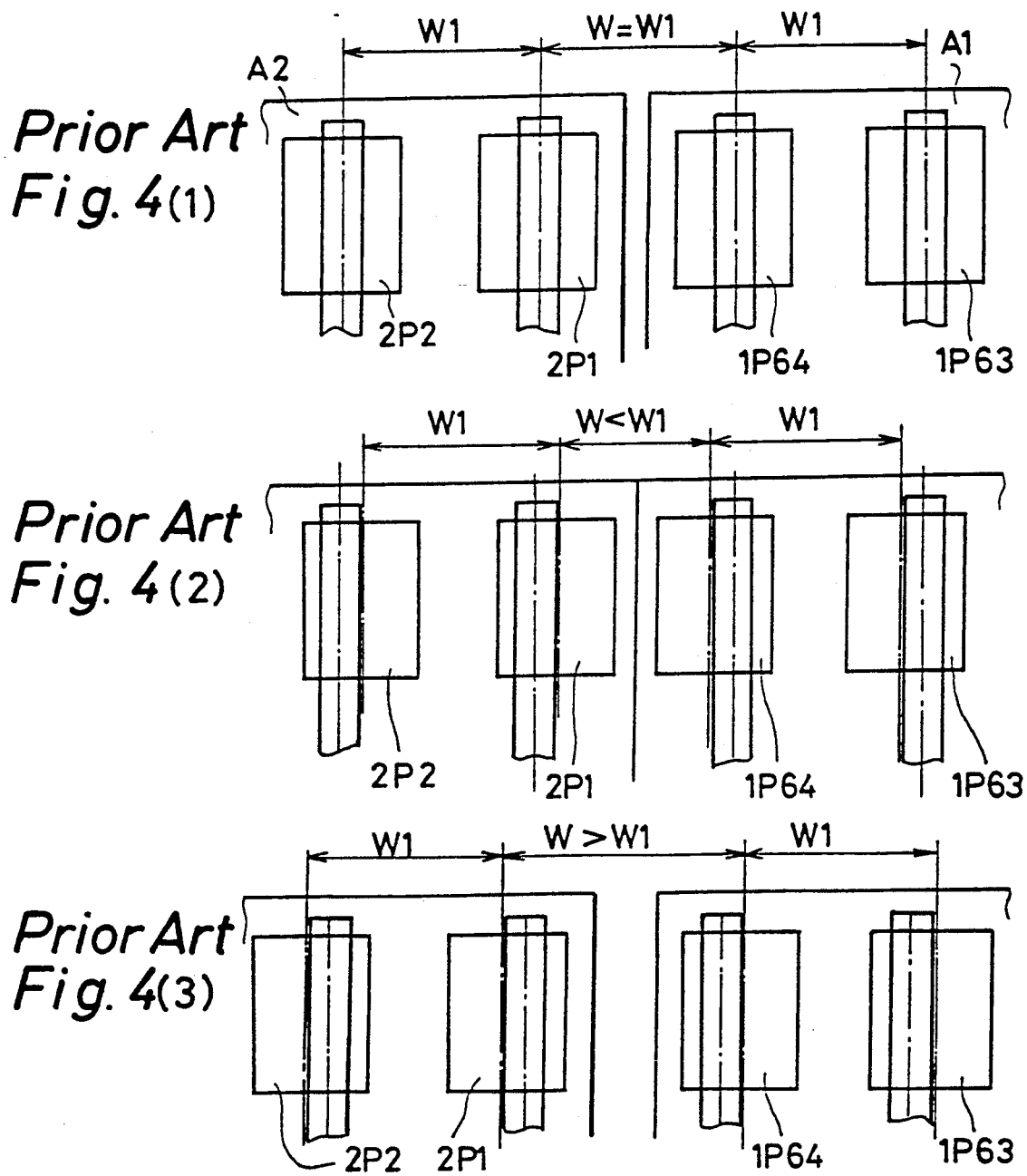
Prior Art Fig. 4(1)
Prior Art Fig. 4(2)
Prior Art Fig. 4(3)

ARRAY OF LIGHT EMITTING DEVICES OR PHOTO DETECTORS WITH MARKER REGIONS

BACKGROUND OF THE INVENTION

1. Field of the Invention

The present invention relates to an optical printer head using plural light emitting devices, or image sensor or other array using plural photo detectors, and apparatus for printing or reading using the array, method of manufacturing the array, and method of mounting the array.

2. Description of the Prior Art

A typical prior art is shown in FIG. 1. In plural light emitting diodes A1, A2, . . . , light emitting regions 1P1 to 1P64, 2P1, 2P2, . . . are neatly arranged in one row. The arrays A1, A2, . . . arranged in one row are used by 40 arrays when the printing paper size is A4 format of the Japanese Industrial Standard and the printing dot density is 300 dots/inch, and the total number of light emitting regions is 2,560 dots. When printing by using such arrays A1, A2, . . . first the light emitting devices are selectively energized to emit light, and a preliminarily charged photosensitive drum is illuminated with light to write an electrostatic latent image. Next, in the developing process, the toner is deposited on the electrostatic latent image portion of the photosensitive drum to develop. Then, the image is transferred to the paper, and is fixed and thus printing is completed.

What is most important here is to mount the arrays A1, A2, . . . precisely on the electric insulating substrate. The printing quality depends on the mounting precision of the arrays A1, A2 installed and arranged as shown in FIG. 2. In other words, for maintaining the printing quality, the interval W between the light emitting regions 1P64 and 2P1 in FIG. 2 must be equal, as much as possible, to the pitch W1 between the remaining light emitting regions 1P1 and 1P64, and 2P1 and 2P64, and it is also important to control the value of deviation d of the vertical direction (the perpendicular direction in FIG. 1 and FIG. 2) with respect to the arranging direction of the arrays A1, A2 (the lateral direction in FIG. 1 and FIG. 2). In particular, the interval W influences the printing quality very much.

Hitherto, an automatic chip mounting device has been used for mounting the arrays A1, A2, . . . which are light emitting diode chips onto a substrate, and the shape of the front face of each array is taken by the television camera, and its image is processed by a computer, and the shape of the array is recognized, and the arrays are positioned and mounted on the predetermined positions on the substrate. By reading the positioning mark of the previously mounted array and the positioning mark of the newly mounted array, and calculating automatically, the arrays are mounted in a linear arrangement. As the positioning mark, in the prior art in FIG. 1, some of the wire bonding pads 1Q1 to 1Q64 to which the electrodes of the light emitting diodes are attached, together with the light emitting regions 1P1 to 1P64, are advantageous since they are made of aluminum and high in reflectivity and hence likely to be imaged, and the practical position recognizing method is to recognize the wire bonding pad 1Q1 (2Q1 in array A2) and wire bonding pad 1Q63, and the center is determined by calculation. These wire bonding pads 1Q1, 1Q63 are longer in the arranging direction (the lateral direction in FIG. 1) as compared with the remaining wire bonding pads 1Q2 to 1Q62, 1Q64, so that they may be recognized easily.

What matters here is that the pitch W1 of the light emitting regions 1P1 to 1P64, 2P1, 2P2, . . . varies between the arrays A1, A2 as indicated by reference W in FIG. 3. More specifically, every time the arrays A1, A2 are mounted, the interval W of the light emitting region varies in a certain fluctuation range. Thus, when the interval W varies, the following adverse effects are brought about to the printing quality. FIG. 3 (1) shows that the arrays A1, A2 are mounted correctly, with the interval W equal to the pitch W1, and accordingly, as shown in FIG. 4 (1), by drawing oblique lines, the print showing each dot is made normally. By contrast, as shown in FIG. 3 (2), in the case that the interval W between the light emitting regions 1P64 and 2P1 of the mutually adjacent arrays A1, A2 is less than the pitch W1, printing is done as shown in FIG. 4 (2), and near the region B1 corresponding to the interval W, the density is higher than in the surroundings, and black streaks are formed on the printing paper. Or, as shown in FIG. 3 (3), in the case that the pitch W between the light emitting regions 1P64 and 2P1 of adjacent arrays A1, A2 is over the pitch W1, as shown in FIG. 4 (3), the density is lower than in the surroundings in the region B2 corresponding to the interval W, so that white streaks are formed on the recording paper. In FIG. 4, meanwhile, printing dots on the recording paper by light emitting regions are indicated by drawing oblique lines.

Therefore, depending on whether the interval W is small or large, black streaks or white streaks are formed on the recording paper, and hence this interval W is very important for the printing quality. The limit of the size of the interval W not adversely affecting the printing quality is within ±10 μm. Meanwhile, this pitch W1 is constant, for example, at 84.6 μm.

The mounting precision of the interval W between the light emitting regions 1P64 and 2P1 of the mutually adjacent arrays A1, A2 is attributable to both the automatic mounting device of the arrays A1, A2 on the substrate, and the positional deviation of the light emitting region and positioning mark. The problem intended to be solved by the invention is related to the positional deviation of the positioning mark with respect to the light emitting region. As this positioning mark, the bonding pads 1Q1, 1Q63 are used. Such bonding pads 1Q1 to 1Q64 are different in process from the light emitting regions 1P1 to 1P64, and therefore when manufacturing this array A1, a mutual positional deviation occurs between the bonding pads 1Q1 to 1Q64 and the light emitting regions 1P1 to 1P64. Therefore, when the arrays A1, A2 in the position deviated state between the bonding pads and light emitting regions are positioned and mounted on the substrate according to the positioning marks 1Q1, 1Q63, it is impossible to raise the precision of the interval W more than the forming precision of the bonding pads 1Q1 to 1Q64 of the arrays A1, A2.

So far, generally, the positional deviation amount of the bonding pad and light emitting region is determined by the positioning precision between the mask for forming the light emitting regions and the mask for forming the bonding pads, and it is a large value of ±10 μm. Therefore, the interval W may produce a maximum deviation of 20 μm, and the printing quality cannot be improved.

In an optical printer head, multiple light emitting diodes are linearly disposed on a semiconductor substrate to compose a picture element array. Multiple picture element arrays are linearly disposed on the substrate, and desired light emitting diodes are illuminated by a control circuit. Ahead of the picture element arrays, a lens array is disposed. The lens array is formed by disposing bar lenses such as self-focusing lenses in one row or in plural rows. The picture from the picture element array is focused on the photosensitive drum through the lens array.

Here, replacing the photosensitive drum with the original copy and using photo diode or photovoltaic array instead of the light emitting diode array, an image sensor is obtained. In this case, the light from the original copy is focused on the photo diode by the lens array, and the original is read.

FIG. 5, FIG. 6 show the compositions used in mounting of picture element arrays in the prior art. In the drawings, numeral 21 is a substrate, 4 is an adhesive layer applied on the substrate 21, and A1, A2, ... (collectively indicated by reference code A) are picture element arrays. Moreover, numeral 8 is a collet, 02 is a pneumatic cylinder, 04 is a control circuit of the pneumatic cylinder, 10 is a table for moving the substrate, and 12 is a surface plate.

In the prior art, the adhesive 4 is applied on the substrate 21, and the picture element array A is picked up and mounted by the collet 8. The collet 8 drives so that the picture element array A may contact with the adhesive 4 at a specific pressure. As far as the thickness of the applied adhesive layer 4 is uniform and the pressure of the collet 8 is constant, the thickness of the adhesive layer 4 after mounting is constant, and the distance between the bottom of the picture element array A and the substrate 21 is uniform. This in general is the mounting method of electronic components, but since no consideration is given to the fluctuation of thickness of the picture element array, the surface height of the array is not uniform.

The state of the picture element array A after mounting is shown in FIG. 6. Although the thickness of the adhesive layer 4 is constant, the thickness is not uniform in the picture element array A, and this fluctuation directly appears on the surface height of the picture element array A.

Ahead of the picture element array A (above in drawing), a lens array not shown in the drawing is provided. When using an array of light emitting diodes as the picture element array, unless the surface height of the array A is uniform, the light from the light emitting diodes is not correctly focused on the photosensitive drum, and the picture quality is lowered. When using photodiodes or photovoltaic cells in the picture element array A, unless the height of the array A is uniform, the light from the original is not correctly focused on the photodiode. As a result, the picture reading precision is lowered.

The picture element array A is, after being mounted, connected with the wiring of the substrate 21 by means of wire bonding or the like. Here, if the height of the picture element array A is not uniform, the pattern recognition at the time of wire bonding is difficult.

In an optical printer head, multiple picture elements such as light emitting diodes are formed on the surface of a semiconductor chip to compose a picture element array, and a plurality of picture element arrays are disposed linearly. These light emitting diodes form dots of a composed picture, and it is necessary to keep the interval between a light emitting diode and another light emitting diode correctly at a uniform spacing. If the intervals between the light emitting diodes are not uniform, white streaks displaying nothing or black streaks forming black linear images are produced.

To keep the intervals between light emitting diodes in one array spaced correctly, it is enough to heighten the shape precision of the masks and others used in forming light emitting diodes, which is easy. The problem lies in the interval between an array and another array, and if this interval varies, the interval is not uniform between the final light emitting diode of an array and the beginning light emitting diode of the next array, and white streaks or black streaks appear.

Conventionally, as a countermeasure, the electrode position of the light emitting diode was detected by pattern recognition by means of television camera or the like, and the array was positioned. However, when the electrode is manufactured in a different process from the light emitting diodes, the position of the electrode may be deviated from the center of the light emitting diode. If the position of the electrode is deviated, the mounting position of the next array is deviated, and white streaks or black streaks may be caused.

The prior art has been herein described by presenting an example of optical printer head, but the same problem also occurs in image sensor and other image reading apparatus. Instead of light emitting diodes, when photo detector arrays of photodiodes or photovoltaic cells are used, an image reading apparatus is obtained. Also in such a image reading apparatus, unless the positions of arrays are correctly determined, the interval of the reading position fluctuates, and the reading precision is lowered.

SUMMARY OF THE INVENTION

It is hence a primary object of the invention to present an apparatus comprising an array of light emitting devices or photo detectors having adjacently disposed arrays positioned with high precision, an apparatus for printing or reading by using such an array, and a method of manufacturing the array.

It is a subject of the invention to present a method of mounting capable of keeping constant the surface height of the picture element array composed of either light emitting devices or photo detectors.

It is a subject of the invention to present a method of mounting capable of adjusting the surface of the picture element array to a uniform height, regardless of the thickness of the substrate.

It is a subject of the invention to keep constant the surface height of the picture element array, by absorbing the fluctuations of the thickness of the picture element array on the adhesive layer.

It is a subject of the invention to present a method of mounting capable of keeping constant the surface height of the picture element array, by utilizing an anisotropic conductive adhesive.

Another subject of the invention is as follows:
1. To read the position of picture element correctly even if the picture element and electrode are deviated in position; and
2. To facilitate detection of marker position, by increasing the quantity of reflected light to the reflected light detecting means.

It is a subject of the invention to facilitate mounting of a picture element array, in addition thereto, by making it possible to mount the reflected light detecting means at a position remote from the marker.

The invention presents an array of light emitting devices or photo detectors comprising:

plural light emitting or light detecting regions formed at constant intervals along a predetermined linear arranging direction, and reference regions possessing the same composition as the light emitting or light detecting regions, and also having predetermined relative positions with respect to the light emitting or light detecting regions, wherein the distance between adjacent arrays can be set on the basis of the reference regions.

According to the invention, connecting terminals to be connected to light emitting or light detecting regions respectively are aligned and formed, parallel to the arranging direction of light emitting or light detecting regions, and the reference regions possessing different shape from the light emitting and light detecting regions and connecting terminals are formed at the ends of the arranging direction of the light emitting or light detecting regions and connecting terminals.

The invention further relates to an apparatus for printing or reading in which plural arrays of light emitting devices or photo detectors are disposed adjacently, wherein each array comprises:

plural light emitting or light detecting regions formed at constant intervals along a predetermined linear arranging direction, and reference regions possessing the same composition as the light emitting or light detecting regions, and having predetermined relative positions with respect to the light emitting or light detecting regions, in which the distance between mutual reference regions formed in adjacent arrays is determined so that the interval of the light emitting or light detecting regions formed at the outermost end portion of the adjacent arrays may be equal to the constant intervals of the light emitting or light detecting regions.

The invention also presents a method for manufacturing arrays of light emitting devices or photo detectors comprising the steps of:

forming a mask on a semiconductor layer, forming penetration holes for plural light emitting or light detecting regions, and penetration holes for reference regions possessing predetermined relative positions with respect to the light emitting or light detecting regions, simultaneously in the mask, and diffusing the light emitting or light detecting regions and reference regions, in the semiconductor layer, through these penetration holes.

In the invention, the reference regions used in positioning by setting the distances between adjacent arrays are formed in the same composition simultaneously when forming the plural light emitting regions or light detecting regions, possessing predetermined relative positions to the light emitting regions and light detecting regions. Therefore, the positional precision of the reference regions and light emitting or light detecting regions can be formed at a precision of within 1 $\mu$m of the mask in photo etching or a similar process. Therefore, on the basis of such reference regions, by mutually positioning the arrays and mounting them for example, on an electric insulating substrate, the interval of the light emitting or light detecting regions of the adjacent arrays may be determined with great precision, and the interval W mentioned in relation to FIG. 4 may be restricted to a small size of, for example, less than ±10 $\mu$m.

Furthermore, according to the invention, the reference regions are formed at the end portions of the arranging direction of connecting terminals such as bonding pads, and the reference regions are different from the length in the arranging direction of the connecting terminals, and therefore when recognizing the reference position by means of, for example, a television camera, the recognition is easy, and errors in detection may be prevented.

Such reference regions of the invention are formed in the same composition simultaneously with the light emitting regions or light detecting regions, and therefore their arrays may be manufactured easily. Or in an apparatus for printing or reading having a plurality of such arrays, the interval of the light emitting regions or light detecting regions may be set at high precision, and the printing quality of image reading may be enhanced.

The reference regions used for setting the distance between mutually adjacent arrays are formed simultaneously when forming the light emitting regions or light detecting regions, with predetermined positions relative to the light emitting or light detecting regions, and hence the adjacent arrays may be positioned at high precision and mounted on an electric insulating substrate or the like, so that the printing quality or reading quality may be enhanced.

According to the invention, in the apparatus for printing or reading disposing plural arrays adjacently, the interval of the printing devices or photo detectors may be set at high precision, and the printing quality or reading quality may be improved. Since such reference regions are formed in the same composition simultaneously with the light emitting or light detecting regions, it is easy to manufacture.

The mounting method of picture element arrays of the invention is a method for mounting multiple picture element arrays of light detecting devices or photo detectors on a substrate by means of a conveying tool, in which a first reference surface is provided in order to determine the reference position of the conveying tool, and the conveying tool is moved from this reference surface by a specific stroke to mount the picture element arrays on the substrate.

Preferably, a second reference surface is disposed for determining the position of the top surface of the substrate.

More preferably, the picture element arrays are fixed on the substrate with an adhesive, and the thickness of the adhesive is varied to absorb the fluctuations of the thickness of the picture element arrays, thereby setting constant the height position of the surface of the picture element arrays.

The picture element arrays are, for example, multiple light emitting diodes formed linearly on a substrate of Ga-As or the like, or multiple photo detectors such as photodiodes and photovoltaic cells integrated on one chip.

In the invention, the reference position of the conveying tool is determined by the first reference surface, and the conveying tool is moved only by a specific stroke. Hence, the surface height of the picture element arrays is determined by the first reference surface and the stroke, and the surface height of the picture element arrays may be kept constant, regardless of the fluctuations in thickness.

In the invention, the height of the top surface of the substrate is kept constant on the second reference surface. The position of the top surface of the substrate is determined by the second reference surface, and the reference position of the conveying tool is determined by the first reference surface. The moving distance of the conveying tool in this interval is determined by the stroke, and the surface height of the picture element array is constant.

The picture element arrays are fixed on the substrate with, preferably, an adhesive layer, and change of thickness of the picture element array in the adhesive layer is absorbed, so that the surface height of the picture element array is kept constant.

The mounting method of picture element arrays of the invention is a method for mounting multiple picture element arrays of light emitting devices or photo detectors on a substrate by means of a conveying tool in which the picture element arrays are sorted in a predetermined range depending on the height, and the picture element arrays are pressed and mounted on a substrate comprising an anisotropic conductive layer by means of a conveying tool, and the interval between the bottom of the picture element arrays and the substrate is kept constant.

Fillers of uniform diameter are mixed in the anisotropic conductive adhesive, and when they are pressed and adhered by means of a collet or other conveying tool, the interval between the top surface of the substrate and the bottom of the picture element arrays is set constant owing to the fillers. Here, by preliminarily sorting the picture element arrays by height, the surface height of the picture element arrays may be set constant.

In the invention, the surface height of the picture element arrays is aligned uniformly, and the picture quality is enhanced, and also wiring to the picture element arrays after mounting may be easy.

In the invention, by positioning the top surface of the substrate, the picture element arrays may be mounted easily even if the thickness of the substrate fluctuates.

In the invention, the fluctuations of the thickness of the picture element arrays are absorbed by the adhesive layer, and the surface height of the picture element arrays is kept constant.

In the invention, the picture element arrays are preliminarily sorted by height, and the thickness of the adhesive is set constant by the use of an anisotropic conductive adhesive, and the surface height of the picture element arrays is kept constant.

The mounting method of picture element arrays of the invention is a method for mounting picture element arrays forming multiple picture elements linearly at equal intervals on a semiconductor chip, on a substrate by determining the mutual configuration in a plurality, in which a marker formed in the same process as the picture elements is disposed in the picture element arrays, the marker is illuminated with an incident light at an angle of within 10 degrees from the vertical direction with respect to the picture element arrays, the reflected light from the marker is detected by the reflected light detecting means to recognize the marker position, and the mounting position of the next picture element array is determined on the basis of this position.

Meanwhile, the marker may be simultaneously illuminated by the light entering at an angle of within 10 degrees from the vertical direction, and the light entering obliquely to the marker. The marker is preferably made of the same mask as the picture element.

The incident light to the marker is projected into the marker by preferably disposing a half-mirror between the reflected light detecting means and marker, and reflecting the light from the light source by the half-mirror. The reflected light from the incident light is led into the reflected light detecting means through the half-mirror.

In the invention, the marker formed in the same process as the picture elements, not electrodes, is used for position recognition. Since the marker is formed by using the same mask as the picture element, for example, the relative position of the picture element and marker is constant. As a result, even if the electrode is deviated from the center of the picture element, it does not matter for position recognition.

When the marker is used for position recognition, the reflected light from the marker is feeble, and it is difficult to detect. The electrodes are generally composed of metals such as Al and Au, and since the reflectivity of light is high, the contrast is sharp, and therefore it is easy to detect. However, since the marker is relatively high in transparency, the difference between the reflectivity of the marker and the reflectivity of the surrounding semiconductor or insulation film is small, and the position recognition is difficult.

The present inventor discovered that an intense reflected light can be obtained when the light is projected nearly vertically (within an angle of 10 degrees) to the marker, so that the marker position can be detected easily. Above the marker, the reflected light detecting means is provided, and it is difficult to install a light source. Preferably, hence, using a half-mirror, the light source is installed in the lateral direction, the light is reflected by the half-mirror and led to the marker, and the reflected light from the marker is led into the reflected light detecting means through the half-mirror.

More preferably, in an optical system combining a half-mirror and a mirror, or a half-mirror and an optical fiber, the light is emitted at an angle of within 10 degrees from the vertical direction to the marker, and the reflected light is led into the reflected light detecting means located at a position remote from the marker, through the optical system.

In this way, the television camera or other reflected light detecting means does not impede, and the picture element arrays may be mounted by means of collet or the like. That is, when the reflected light detecting means is disposed immediately above the picture element arrays, the reflected light detecting means impedes the motion of the collet, and the substrate must be moved reciprocally, on every occasion of position recognition, between the lower position of the collet and the lower position of the reflected light detecting means. Such evading movement lowers the productivity and may lead to deviation of the position. By contrast, when the reflected light detecting means is disposed at a position remote from the picture element array, the marker position of the picture element array may be recognized without evading motion, and the next picture element array may be mounted by the collet or the like.

In the invention, the marker manufactured in the same process as the picture element is used for position recognition, and even if the position of the electrode and picture element is deviated, the position of the picture element can be recognized. The marker is illuminated with the light from a nearly vertical direction, and therefore detection of reflected light by the reflected light detecting means is easy.

In the invention, position recognition and mounting of picture elements are realized without the risk of collision with the position recognition means such as television camera and mounting jig such as a collet, and evading motion of the substrate is not necessary.

BRIEF DESCRIPTION OF THE DRAWINGS

Other and further objects, features, and advantages of the invention will be more explicit from the following detailed description taken with reference to the drawings wherein:

FIG. 2 is a plan view for explaining the interval W between light emitting regions 1P64 and 2P1 of the adjacent arrays A1, A2, FIG. 3 is a plan view showing the state of arrangement of arrays A1, A2, FIG. 4 is a simplified view of the image obtained on the recording paper by means of the arrays A1, A2 disposed in a mode shown in FIG. 3.

DETAILED DESCRIPTION OF THE PREFERRED EMBODIMENTS

Figure 1:
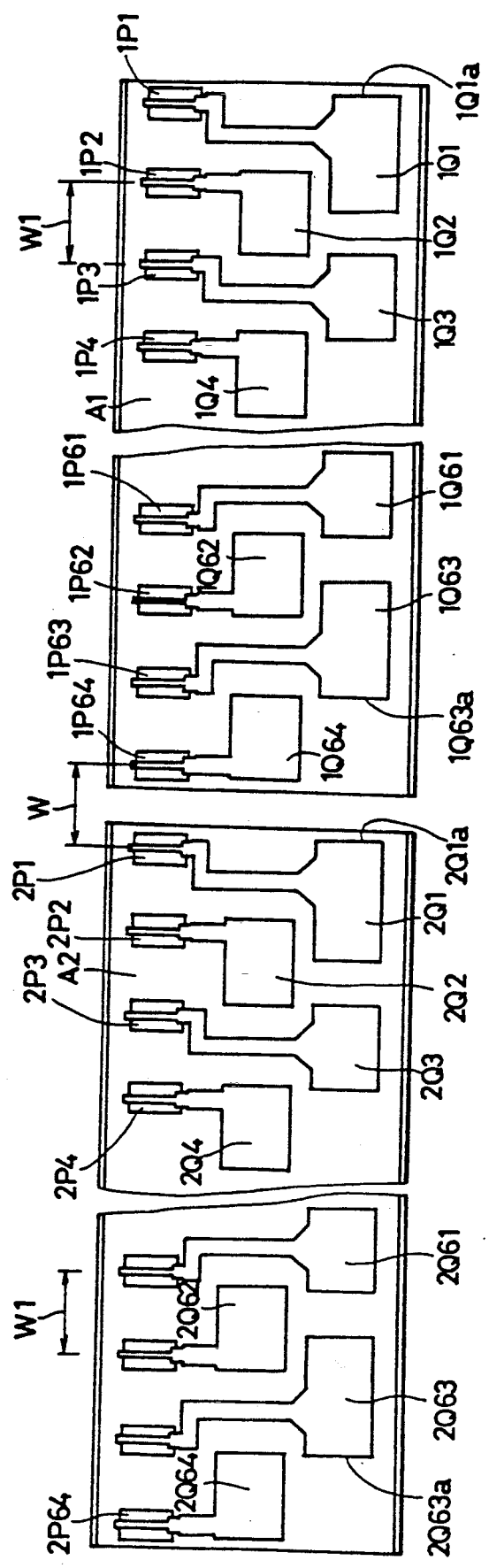
FIG. 1 is a plan view of arrays A1, A2 of the prior art.
Figure 5:
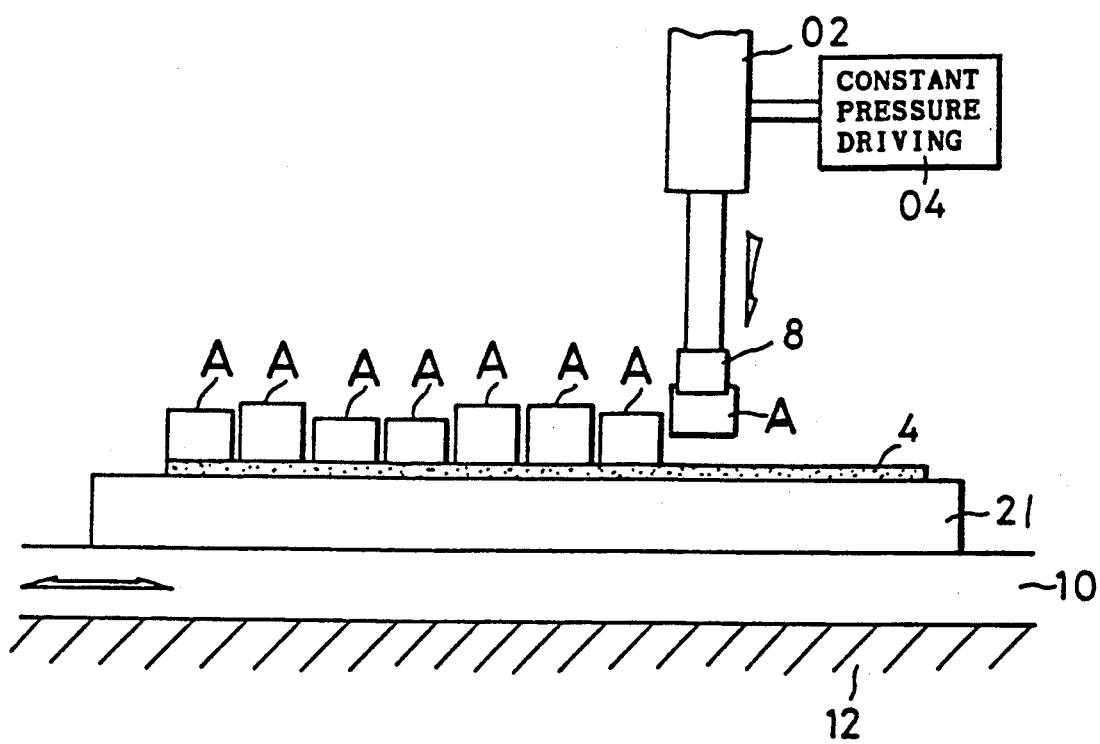
FIG. 5 is a drawing showing a mounting method of picture element arrays in a different prior art.
Figure 6:
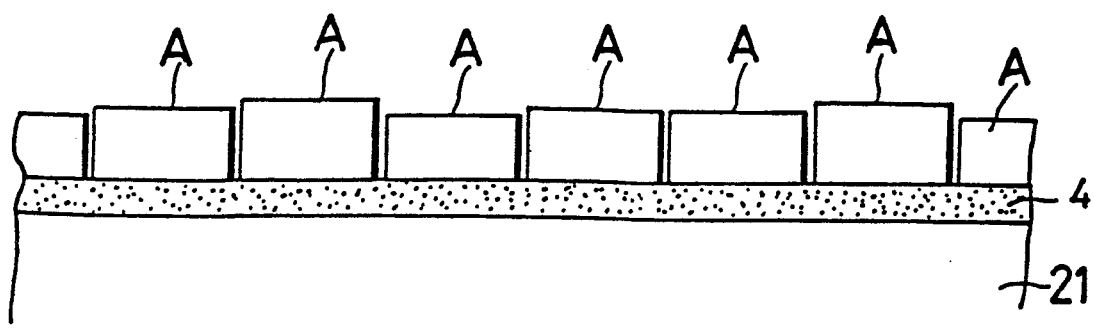
FIG. 6 is a front view of a picture element array after being mounted in a prior art.

Now referring to the drawing, preferred embodiments of the invention are described below.

Figure 7:
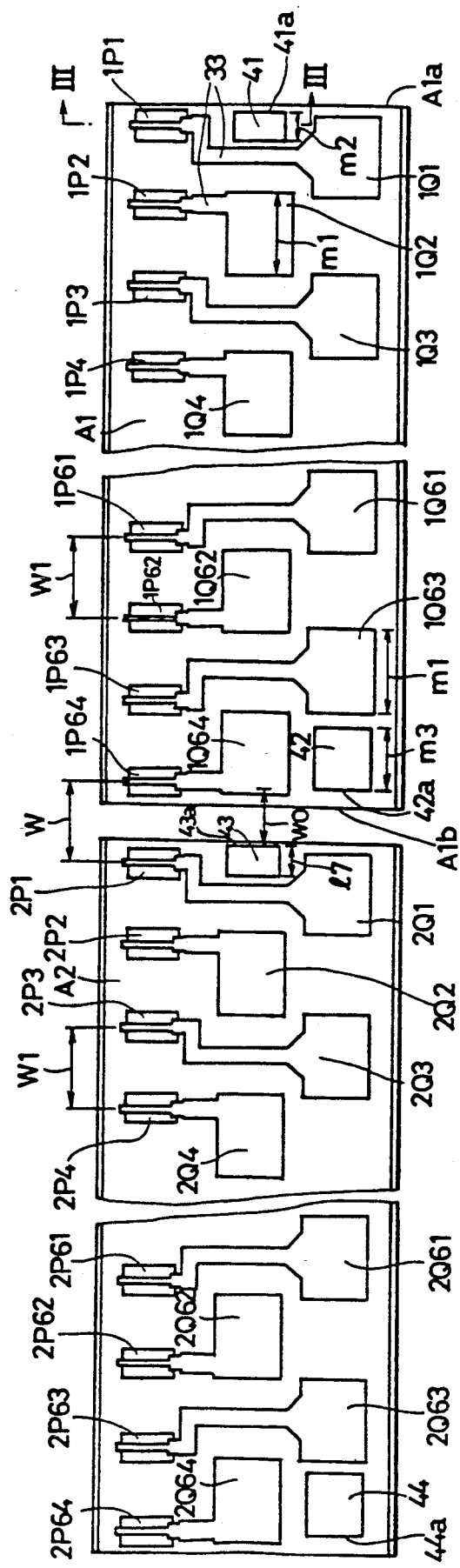
FIG. 7 is a plan view of arrays A1, A2 in an embodiment of the invention.
Figure 8:
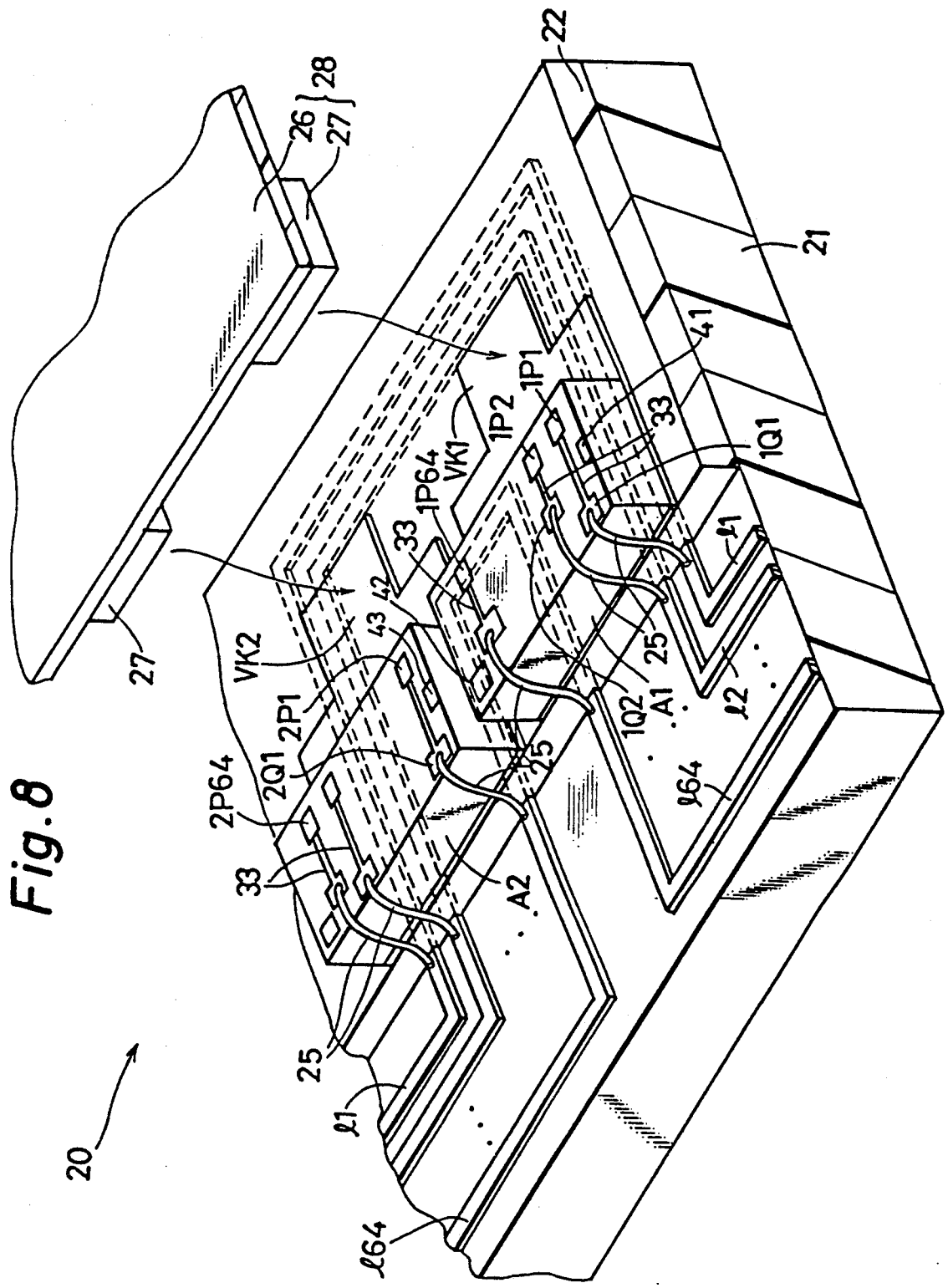
FIG. 8 is a perspective exploded view of an optical printer head 20 using the same arrays A1, A2.

FIG. 7 is a plan view of arrays A1, A2, ... of an embodiment of the invention, and FIG. 8 is a perspective view of an optical printer head using these arrays A1, A2, ... The array A1 possesses a total of 64 light emitting diodes, including light emitting regions 1P1 to 1P64 disposed at a pitch of W1=84.6 μm, and wire bonding pads 1Q1 to 1Q64 which are electrodes made of aluminum or similar material connected individually thereto. The other arrays A2, ... are composed same as the array A1. These arrays A1, A2, ... are mounted on a substrate 21 made of an electrical insulating material such as ceramics and glass. On the surface of the substrate 21, individual signal lines 1 to 64 are formed in zigzag or crank form. An electrical insulating layer 22 is formed on the individual signal lines 11 to 164.

On this electrical insulating layer 22, common signal electrodes VK1, VK2, ... are formed at every one of the arrays A1, A2, ... On the common signal electrodes VK1, VK2, ..., the arrays A1, A2, ... are individually coupled, and the common signal electrodes VK1, VK2, ... function as one-side terminals for illuminating by passing electric current to light emitting regions 1P1 to 1P64, 2P1, 2P2, ... of the light emitting diodes of the arrays A1, A2, ...

The light emitting regions 1P1 to 1P64 of the light emitting diodes are arranged linearly on the array A1, and 40 arrays A1, A2, ... having a similar composition are linearly arranged, and thereby a total of 2,560 light emitting diodes can be used for the purpose of printing.

The individual signal lines 11 to 164 and common signal electrodes VK1, VK2, ... are formed by thin film technology such as vapor deposition and sputtering, or by thick film technology such as screen printing. The individual signal lines 11 to 164 are connected to the output terminals of a driving circuit disposed at one side (the left side in FIG. 8) of the arrays A1, A2, ..., individually by bonding wires. This driving circuit is to illuminate and drive the light emitting regions 1P1 to 1P64 of the light emitting diodes by responding to the printing data signals, and they are fabricated by the semiconductor technology.

The light emitting regions 1P1 to 1P64 of the light emitting diodes are individually connected to the wire bonding pads 1Q1 to 1Q64 which are connecting terminals through connecting conductors 33. The wire bonding pads 1Q1 to 1Q64 are individually connected to the portions not covered with the electric insulating layer 22 of the individual signal lines 11 to 164, with bonding wires 25. Such connecting structure is the same in the other arrays A2, ... Thus, for example, the light emitting regions 1P1, 2P64; 1P2, 2P63; ... ; 1P64, 2P1 of the light emitting regions 1P1 to 1P64 of the light emitting diodes in the arrays A1, A2 are mutually connected through the individual signal lines 11 to 164. The common signal electrodes VK1, VK2, ... are individually connected to the electrode 27 formed on a flexible film 26. This flexible film 26 and electrodes 27 compose a flexible wiring board 28.

According to the invention, when forming the light emitting regions 1P1 to 1P64 of the light emitting diodes, reference regions 41, 42 are formed at the same time, and are used as the positioning marks for setting the mutual distance of adjacent arrays. In the array A2, likewise, reference regions 43, 44 are formed as positioning marks.

Figure 9:
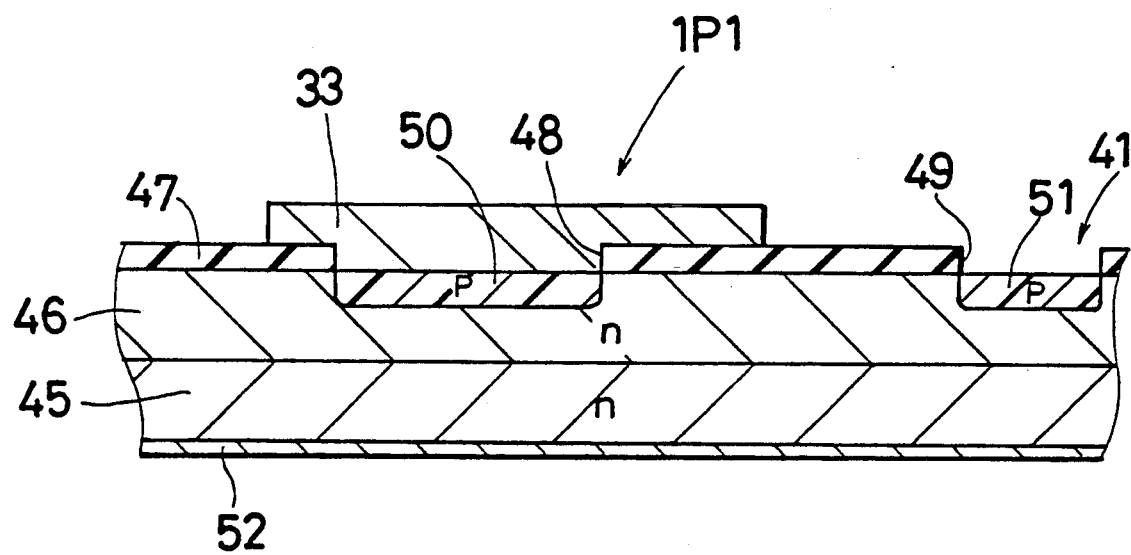
FIG. 9 is a sectional view seen from cross section X9—X9 in FIG. 7.

FIG. 9 is a sectional view seen from cross section line X9—X9 of the array A1 in FIG. 7. In the case of light emitting diodes made of GaAsP compound, first a GaAs semiconductor n-type substrate 45 is put in a furnace and heated to a high temperature, and is brought to contact with gas properly containing AsH$_3$ (arsine), PH$_3$ (phosphine) and Ga, and a single crystal layer 46 of GaAsP of n-type semiconductor is grown on the surface of the substrate 45. On this layer 46, using a mask 47 of Si$_3$N$_4$, penetration holes 48, 49 are formed. The penetration hole 48 corresponds to a light emitting region 1P1, and the penetration hole 49, to the reference region 41. The penetration holes 48, 49 are exposed to gas of Zn, and Zn is diffused in a part of the GaAsP single crystal layer 46 of n-type semiconductor, and p-type semiconductor layers 50, 51 are formed, thereby composing a pn junction. On the p-type semiconductor layer 50, a connecting conductor 33 made of aluminum of similar material is disposed, and a common electrode 52 is formed on the bottom of the semiconductor substrate 45, thereby making it possible to emit light in the light emitting region 1P1. Simultaneously with formation of the light emitting region 1P1, the remaining light emitting regions 1P2, 1P64 are similarly formed, and another reference region 42 is formed at the same time. The wire bonding pads 1Q1 to 1P64 are formed simultaneously with the connecting conductor 33. Instead of GaAsP compound, GaAlAs or the like may be also used.

In forming the penetration holes 48, 49 in such mask 47, etching is effected by the resist pattern formed by photo mask. Therefore, the relative positions of the light emitting regions 1P1 to 1P64 and reference regions 41, 42 are high in precision, being controlled in an error range of, for example, less than ±10 μm, and the error is, say, about ±1 μm.

The width m1 of the wire bonding pads 1Q1 to 1Q64 in the arranging direction (the lateral direction in FIG. 7) is, for example, 110 μm, and the width m2 of the reference region 41 formed adjacently to the wire bonding pad 1Q2 in the arranging direction is, say, 35 μm, and the width m3 of the reference region 42 formed adjacently to the wire bonding pad 1Q63 is 70 μm. Thus, by defining m1≠m2, m1≠m3, the wire bonding pads 1Q1 to 1Q64, and the reference regions 41, 42 may be distinguished clearly. These reference regions 41, 42 are provided at the outermost end portion in the arranging direction of the array A1.

In mounting the arrays A1, A2 on the substrate 21, using an automatic mounting device, the front shape of the arrays A1, A2 is taken by the television camera, and its image is processed by computer, and the positioning mark 41 or 42 in the array A1 is recognized, and the positioning mark 43 in the reference region of the adjacent array A2 is read. In consequence, calculating automatically so that the interval of the positioning marks 42, 43 may be a predetermined interval, the arrays A1, A2 are mounted sequentially so as to achieve W=W1. The positioning marks 41, 42 are desired to be located as closely as possible to the both end portions A1a, A1b in the arranging direction of the array A1 in order to shorten the moving time of the television camera and curtail the time required in recognition, and for example, it is preferable to have an interval of about 200 μm from the outermost end portion of the array A1. If these reference regions 41, 42 are too close to the outermost end portions A1a, A1b of the array A1, the positioning marks 41a, 42a may be broken by the cracks formed at the time of division of the semiconductor chip of the array A1, and a position at a distance of at least 10 μm is desired. The reference regions 41, 42 are different in shape from their surrounding in order to shorten the operation time required for recognition by computer processing, but in another embodiment of the invention, they may be identical in shape with the wire bonding pads 1Q1 to 1Q64 or light emitting regions 1P1 to 1P64. Or in a different embodiment of the invention, the upper and lower positions of the reference regions 41, 42 in FIG. 7 may be determined at intermediate positions of the light emitting regions 1P1 to 1P64 and wire bonding pads 1Q1 to 1Q64, and therefore since there is no similar shape to the reference regions 41, 42 in the vicinity of the arranging direction (the lateral direction in FIG. 7), they can be recognized easily.

The invention is realized not only in relation to the printing apparatus such as an optical printer head using the light emitting devices such as light emitting diodes, but also in relation to the reading apparatus such as an image sensor using photo detectors.

Figure 10:
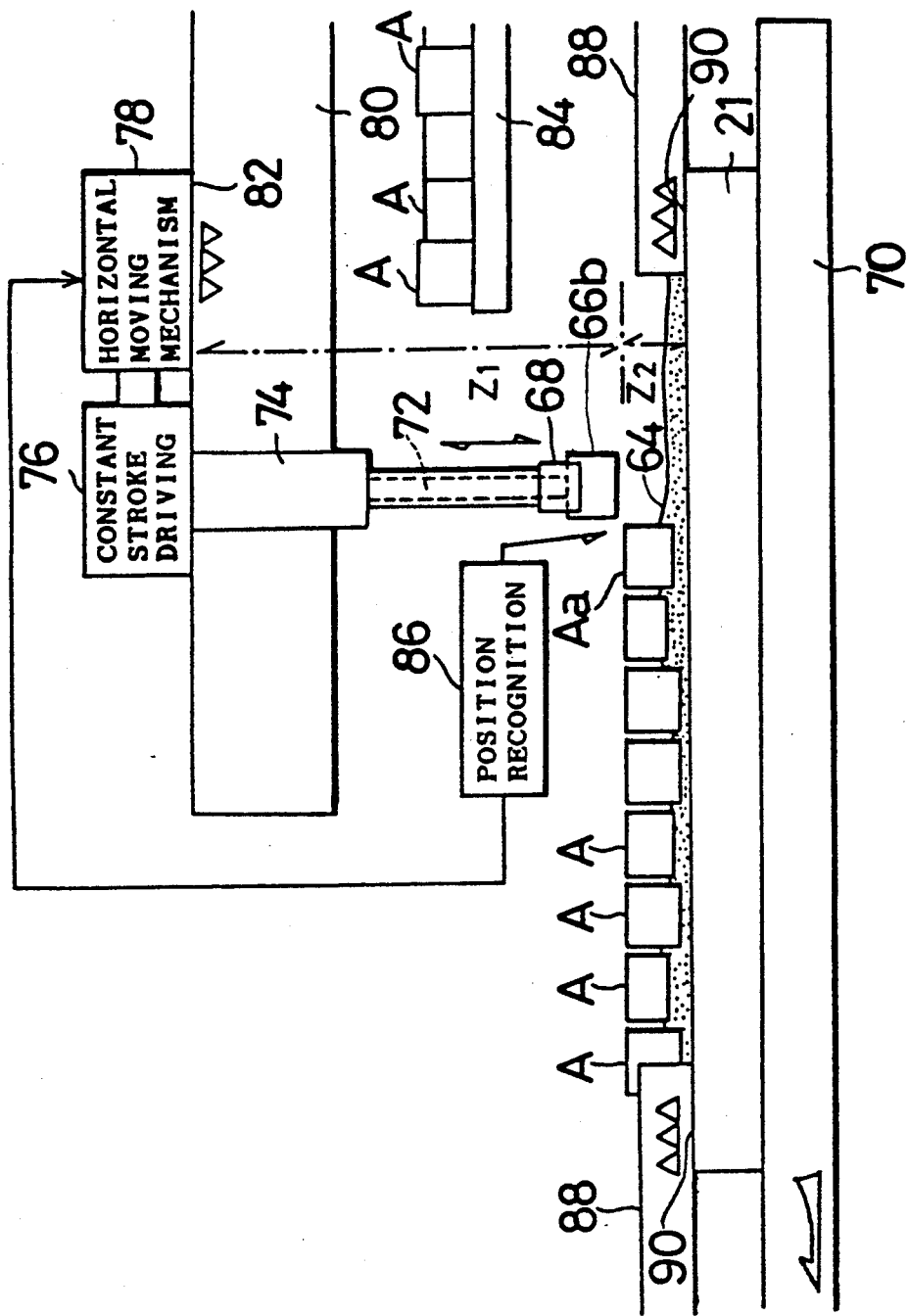
FIG. 10 is a drawing showing a mounting method of picture element arrays in other embodiment.

FIG. 10 shows a mounting method of picture element array in an embodiment. In the diagram, numeral 21 is a substrate of glass, ceramics, glass epoxy, etc., 64 is an adhesive layer of conductive adhesive or the like, and A is a picture element array. As the picture element array A, for example, multiple light emitting diodes are linearly formed on a Ga-As substrate. Instead of the light emitting diodes, photo diodes and other arrays may be used. Or solder may be used instead of the adhesive layer 64.

Numeral 68 is a collet as a conveying tool, and 70 is a moving table for laterally feeding the substrate 21. The collet 68 has a suction pipe 72 to suck and hold the picture element array A. Numeral 74 is a pneumatic cylinder for lifting and lowering, and 76 is a drive mechanism of the pneumatic cylinder 74, which lifts or lowers the collet 68 by a specific stroke from the reference position. The above conveying mechanism may be changed to an arbitrary conveying tool as far as capable of determining the reference position and stroke. Numeral 78 is a horizontal moving mechanism of the collet 68, 80 is a table for holding the collet 68 and others, and 82 is a first reference surface disposed on the top surface of the table 80. The reference surface 82 keeps the height constant by positioning. Here, the reference position of the collet 68 is determined by the reference surface 82, but any other piece capable of determining the reference position of the collet 68 may be used as the first reference surface.

Numeral 84 is a table on which the picture element array A is put, and 86 is position recognition means for recognizing the position of the picture element array Aa right after mounting, and positioning the picture element array Ab to be mounted next. Numeral 88 is an arm abutting against the top surface of the substrate 21, and the abutting surface 90 against the substrate 21 is a second reference surface.

Figure 11:
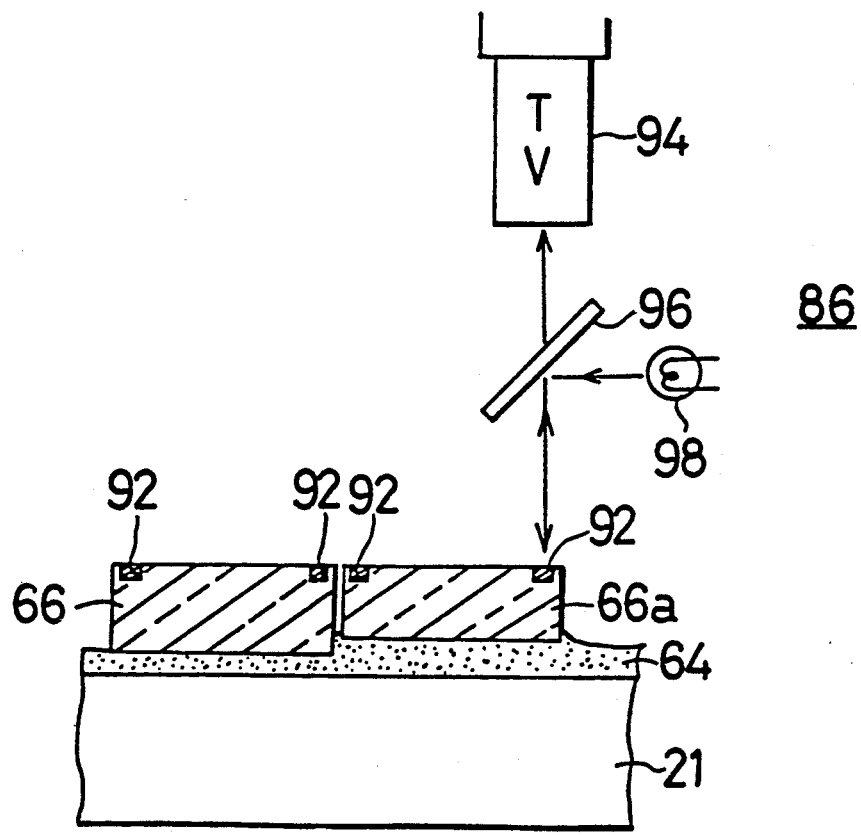
FIG. 11 is a drawing showing a position recognition method of picture element arrays in the same embodiment.

The detail of the position recognition means 86 is shown in FIG. 11. On the surface of the picture element array A, there are multiple light emitting diodes which are not shown. Here, when manufacturing the light emitting diodes, a mark 92 is formed by using the same mask. Since the mask 92 is manufactured by using the same mask as the light emitting diodes, the relative positions are the same. Numeral 94 is a television camera, 96 is a half-mirror, and 98 is a light source. The light of the light source 98 is reflected by the half-mirror 96, and is emitted to the mark 92 of the picture element array Aa. The reflected light from the mark 92 is led to the television camera 94 through the half-mirror 96, and the position of the mark 92 is detected. The position of the mark 92 is in a specific relation with the position of the light emitting diode, from which the position of the final light emitting diode (the right end in the drawing) of the picture element array Aa is detected. On the basis of this position, the position of the picture element array Ab to be mounted next is determined. The reason for using the half-mirror 96 is that the reflected light from the mark 92 is feeble, and by emitting the light nearly vertical to the mark 92 (for example, within 10 degrees), the reflected light from the mark 92 is intensified so as to be easy to recognize. When the position of the light emitting diode mounted immediately before is recognized, the position of the light emitting diode to be mounted next is determined, so that the interval of the light emitting diode and the succeeding light emitting diode may be kept constant.

Going back to FIG. 10, the mounting process of the picture element array A is explained. The mean thickness of the picture element array A is about 300 μm, and a thickness fluctuation of about ±20 μm is present. The substrate 21 is preliminarily coated with an adhesive layer 64 in a thickness of about 40 to 50 μm, and the position of the top surface of the substrate is kept constant on the second reference surface 90. The position of the picture element array Aa mounted immediately before is recognized by the position recognition means 86. In this period, the collet 68 moves to, for example, the table 84, thereby picking up the picture element array A. After the position recognition, the table 70 is moved, and the collet 68 and the substrate 21 are positioned.

Next, the collet 68 descends by a specific stroke by air pressure, and the picture element array A is fixed with the adhesive layer 64. At this time, the position of the top surface of the substrate is constant on the second reference surface 90, and the motion start position of the collet 68 is constant on the first reference surface 82. The stroke of the collet 68 is constant, and the surface height of the picture element array A is set constant. That is, the width Z1 from the first reference surface 82 to the surface of the picture element array A is specified by the reference surface 82 and stroke, and is constant. The height Z2 from the top surface of the substrate to the surface of the picture element array A is constant because the Z1 value is constant and the position of the top surface of the substrate is specific. Therefore, when the precision of the first reference surface 82 and second reference surface 90 and the precision of the stroke are set around 2 to 3 μm, the fluctuation of the surface height may be controlled, for example, under several micrometers in the picture element array A of which thickness fluctuation is about ±20 μm.

Figure 12:
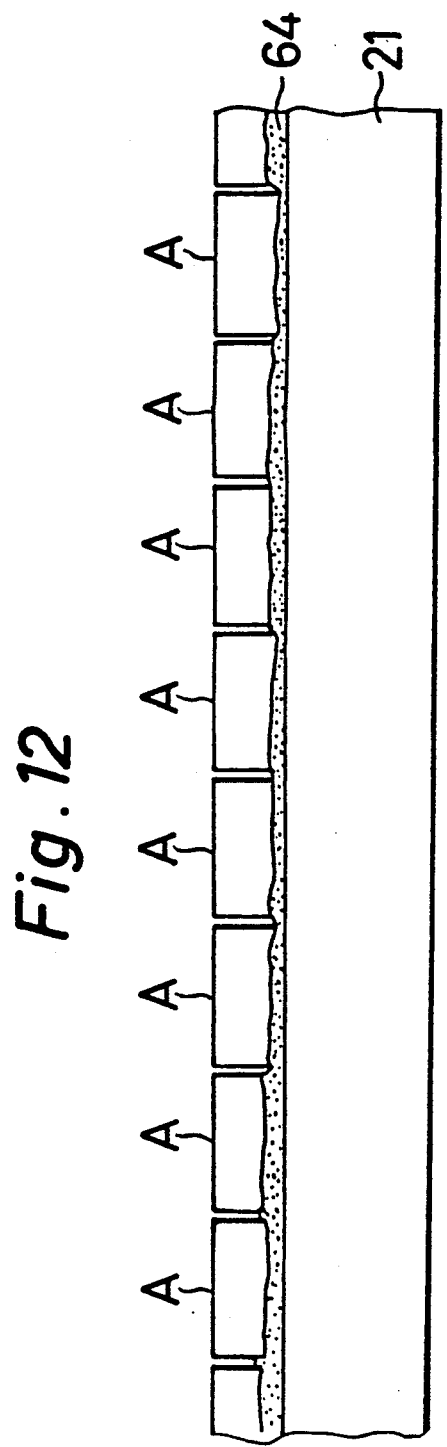
FIG. 12 is a front view of a picture element array after being mounted.

The adhesive layer 64 is about 40 to 50 μm thick, and the thickness changes by the portion of the fluctuation of the thickness of the picture element array A by the pressure of the collet 68. The picture element array A involves a thickness dispersion of about ±20 μm, and the thickness of the adhesive layer 64 after mounting is around ±20 μm, mainly ranging from 20 to 30 μm. The adhesive layer 64 is a conductive adhesive, and the common terminal disposed on the bottom of the picture element array A conducts with the wiring on the substrate. The picture element array A after mounting is shown in FIG. 12. The thickness of the adhesive layer 64 fluctuates, but the surface height of the picture element array A is constant.

Upon completion of mounting of the picture element array A, the surface electrode of the array A and the wiring on the substrate 21 are connected by wire bonding or the like. At this time, since the surface height of the array A is constant, the focus is matched, and the pattern recognition is easy.

The substrate 21 after wiring is connected with a lens array which is not shown in the drawing. Since the surface height of the picture element array A is aligned, by setting the interval against the lens array constant, the light from the light emitting diode may be focused on the photosensitive drum by the lens array. If the surface height of the picture element array is not aligned, the focus is not matched, and the image is disturbed. The lens array is often small in focal depth, and the image disturbance is significant.

A modification of the embodiment is described below. The reason for setting the second reference surface 90 is to remove the effect of the thickness fluctuations of the substrate 21, and when the position of the top surface of the substrate is specific, the reference surface 90 may not be required. However, when the substrate top surface is not specific, if the reference surface 90 is not provided, the collet 68 may not contact with the adhesive layer 64 if lowered. Meanwhile, the collet 68 itself and its moving mechanisms 76, 78 are known, and hence any conveying tool may be used as far as capable of moving from a specific reference surface 82 by a specific stroke.

The picture element arrays A may be preliminarily sorted by the height and used. For example, those in a range of ±20 μm are divided into 20 groups of ±1 μm or 10 groups of ±2 μm. As the adhesive 64, an anisotropic conductive adhesive is used. As the anisotropic conductive adhesive, a conductive filler of uniform diameter is mixed in. The filler contacts the wiring on the substrate 21 and the common terminal disposed on the bottom of the picture element array A by the pressure from the collet 68 so as to set the two in conduction. Since the filler diameter is constant, the bottom height of the array A to the reference surface 90 used for positioning of the top of the substrate is constant. Hence, by preliminarily sorting the picture element arrays A by height and using in groups, the surface height of the picture element array A to the substrate top surface may be kept constant.

Incidentally, when sorting the picture element arrays A, the mounting precision may be increased by combining with the mounting method making use of the stroke of the collet 68, and keeping the stroke constant and sorting out preliminarily.

Figure 13:
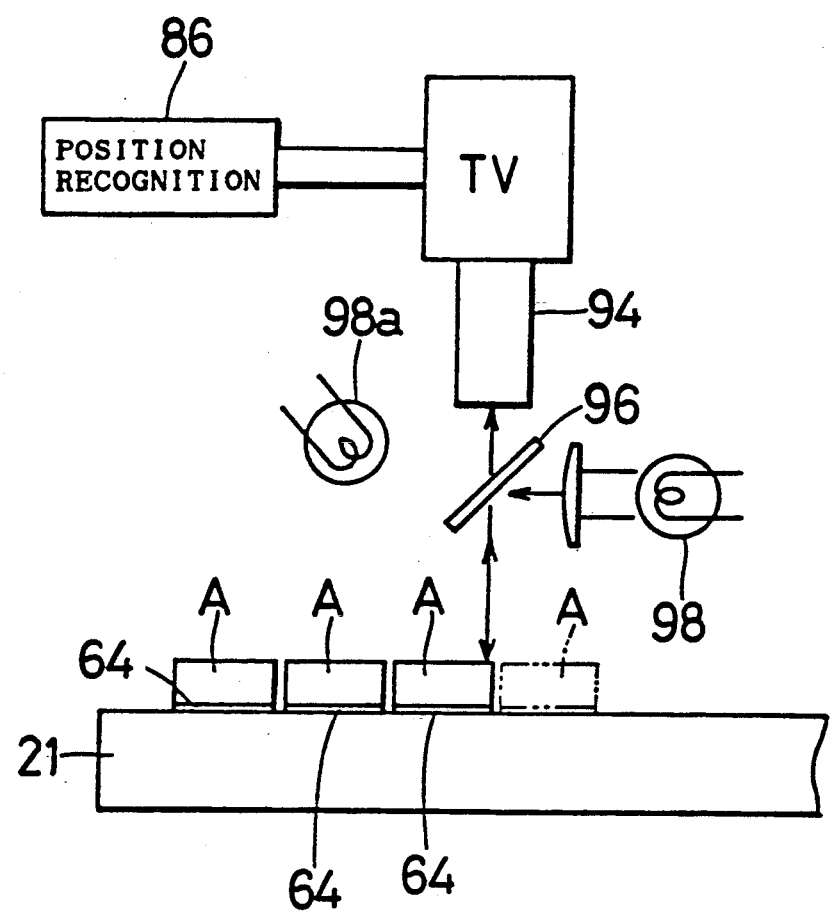
FIG. 13 is a front view of a different embodiment.

FIG. 13 shows an overall layout of another embodiment of the invention. In the drawing, numeral 21 is a substrate of glass, ceramics or the like, A is a picture element array forming about 64 light emitting diodes linearly on a semiconductor of Ga-As or the like, and 64 is an adhesive layer between the picture element array A and substrate 21.

Numeral 94 is means for detecting reflected light such as television camera, which detects the position of the marks disposed at both ends of the picture element array A. Numeral 86 is means for position recognition, which compares the mark position of the temporarily placed picture element array A to be mounted next (indicated by chain line) and the mark position of the picture element array mounted immediately before, by a signal from the reflected light detecting means 94, determines the difference between the interval of the two marks and the predetermined interval, and determines the mounting position of the next picture element array A (indicated by chain line) according to this difference. Moreover, 98a is a light source installed in an oblique direction to the mark, 98 is a light source installed in the horizontal direction of the mark, and 96 is a half-mirror. The light source 98a in the oblique direction may not be necessarily required, and the light from the light source 98 in the horizontal direction is projected to the mark at an angle of within 10 degrees from the vertical direction through the half-mirror 96.

Figure 14:
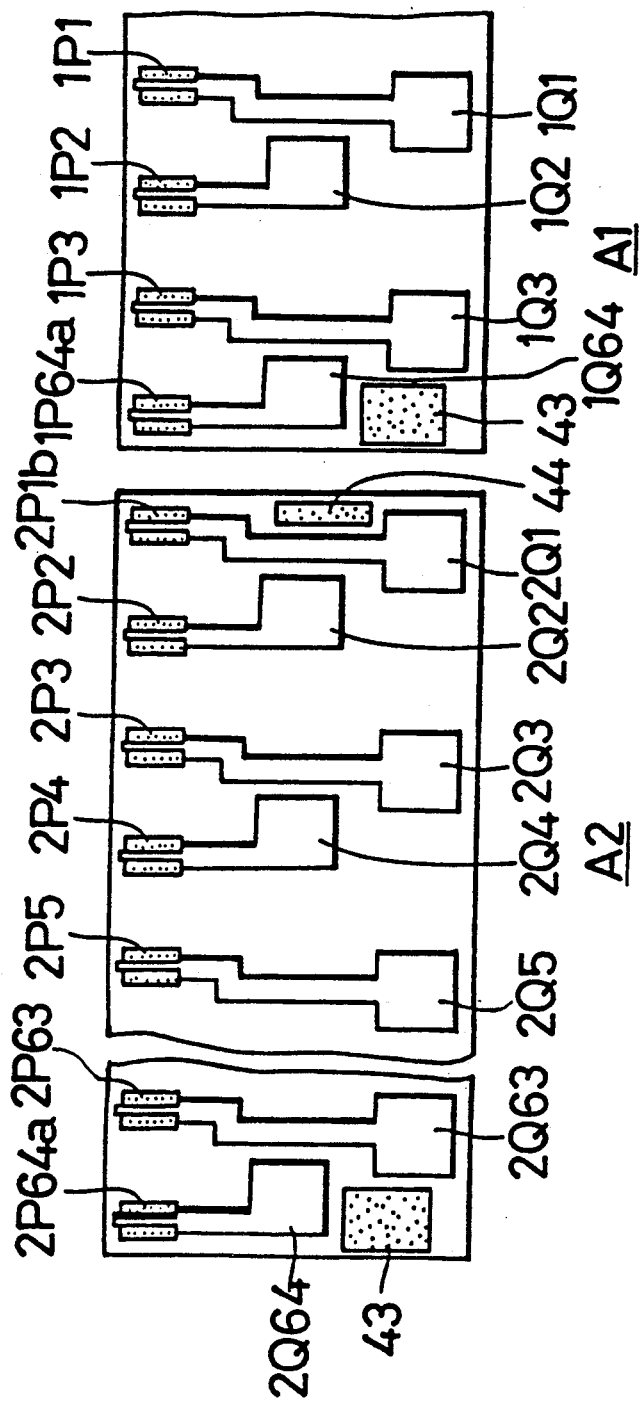
FIG. 14 is a front view of a picture element array used in this embodiment.

FIG. 14 shows the detail of the picture element array A. In the diagram, 1P1, 1P2, . . . (collectively indicated by P) are light emitting parts of light emitting diodes or the like, and, for example, about 64 of them are integrated linearly on one picture element array A. More specifically, 1P4a is the starting light emitting part of the array, and 2P1b is the ending light emitting part. 1Q1, 1Q2, . . . (collectively indicated by Q) are electrodes, which are, for example, aluminum electrodes. Numeral 43 is the mark indicating the beginning position of the picture element array A, and 44 is the marks showing the final position. The shape of the marks 43, 44 may be arbitrary as far as the position can be recognized, and besides the rectangular shape, the square, circular or oval shape may be used. For example, about 40 picture element arrays A are disposed linearly to be used as the light source of an optical printer head.

Figure 15:
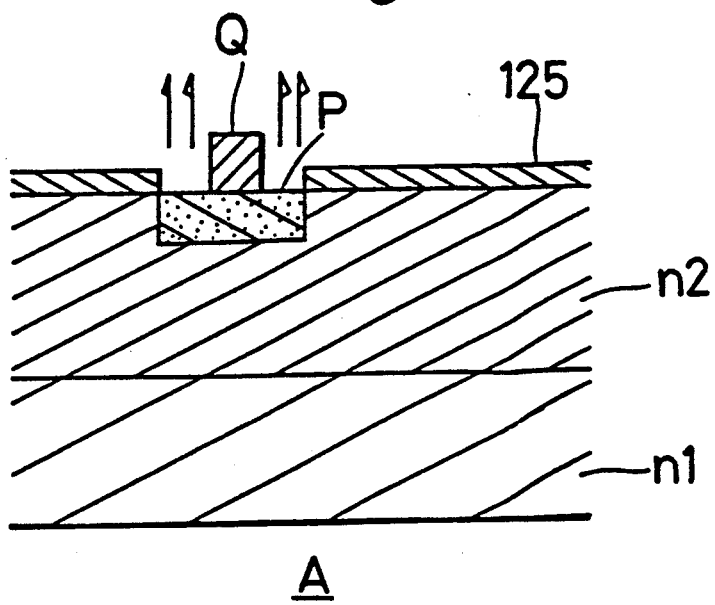
FIG. 15 is a sectional view thereof.

FIG. 15 shows the section of a picture element array. In the drawing, n1 is a GaAs substrate, and n2 is an n-type layer having GaAsP epitaxially grown on the GaAs substrate, and a light emitting part P is composed of a p-type layer having a p-type impurity diffused and implanted in the n-type layer n2. A window is opened in the light emitting part P. The electrodes 1Q1, 1Q2, . . . are laminated and projected on the light emitting part P, and the light emitting part P is illuminated on the interface of the p-type layer and n-type layer by the current from the electrode.

In manufacturing the picture element array A, using a diffusion mask 125 in the n-type layer n2, the light emitting part P and marks 43, 44 are formed. They are formed simultaneously by the same mask. Next, the electrodes 1Q1, 1Q2, . . . are formed by using a proper mask to compose the picture element array A.

Figure 16:
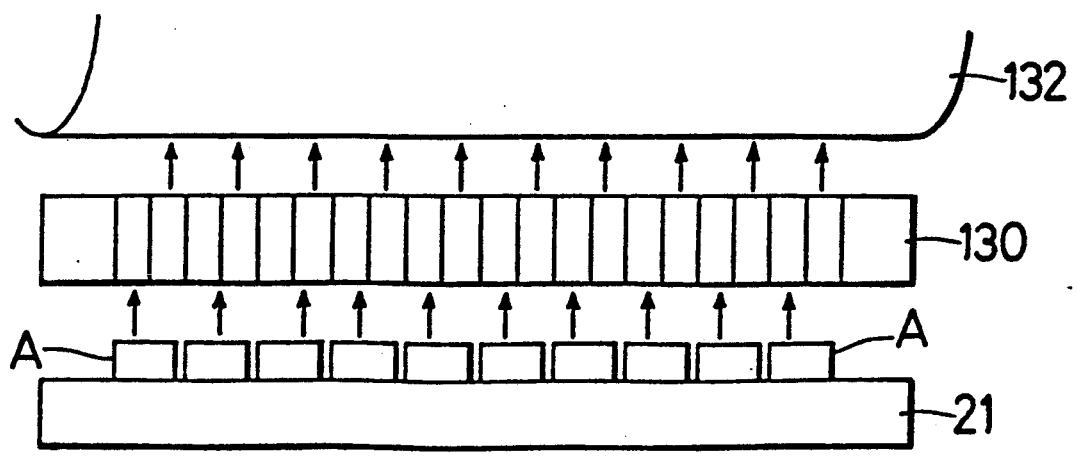
FIG. 16 is a front view of an optical printer head manufactured in an embodiment.

FIG. 16 shows an overall structure of an optical printer head. On the upper surface of the linearly arranged picture element array A, a bar-shaped self-focusing lens 130 is disposed and the light from the light emitting diodes P is collected and imaged on a photosensitive drum 132. When the light emitting part P is deviated from the center line of the self-focusing lens 130, the light of the light emitting part P is no longer focused on the photosensitive drum 132. Accordingly, the light emitting parts P must be arranged linearly.

The operation of the foregoing embodiments is described below. The light emitting parts P and marks 43, 44 are manufactured in the same process by using the same mask. Accordingly, within one picture element array A, the relative positions of the light emitting parts P and marks 43, 44 are specific, and the light emitting parts P may be linearly arranged at equal intervals.

In mounting the picture element array A on the substrate 21, the picture element array A is picked up by a collet which is not shown herein, and is temporarily put on the substrate 21 by using an adhesive 64. On every occasion of putting on the substrate temporarily, the position of the end mark 44 is detected by the position recognition means 86 by a television camera 94, and the spacing between the preceding picture element array and the next array place temporarily to be mounted is determined, and the difference from the predetermined interval is found, and the position of the temporary array is corrected and fixed so as to nullify this difference. In this case, since the mark 44 has been manufactured using the same mask as the light emitting parts P, their relative positions are specific and once the position of the mark 44 is detected, the position of the final light emitting parts 2P1b, . . . is automatically determined.

Meanwhile, the position recognition means 86 is used not only for positioning the array A to be mounted next, but also for checking if the mounted array A is correctly placed or not. For this purpose, the positions of the marks 43, 44 are checked by the position recognition means 86. The reason for using the mark 44 for positioning purpose is that the electrodes 1Q1, 1Q2, . . . and the light emitting parts P are manufactured by using different marks, thereby resulting in fluctuations of about 10 $\mu$m in their relative positions.

The mark 44 is irradiated with the light from the light source 98a in the oblique direction and that from the light source 98 in the horizontal direction simultaneously. Immediately above the mark 44, a television camera 94 is disposed, and it is hard to install a light source. Accordingly, the light from the light source 98 in the horizontal direction is reflected in a direction nearly vertical to the mark 44 by the half-mirror 96 to illuminate the mark 44, and the reflected light is led to the television camera 94 through the half-mirror 96. The reflected light is stronger in the light from the light source 98, and it is mainly the light from the light source 98 that is used in position recognition.

Figure 17:
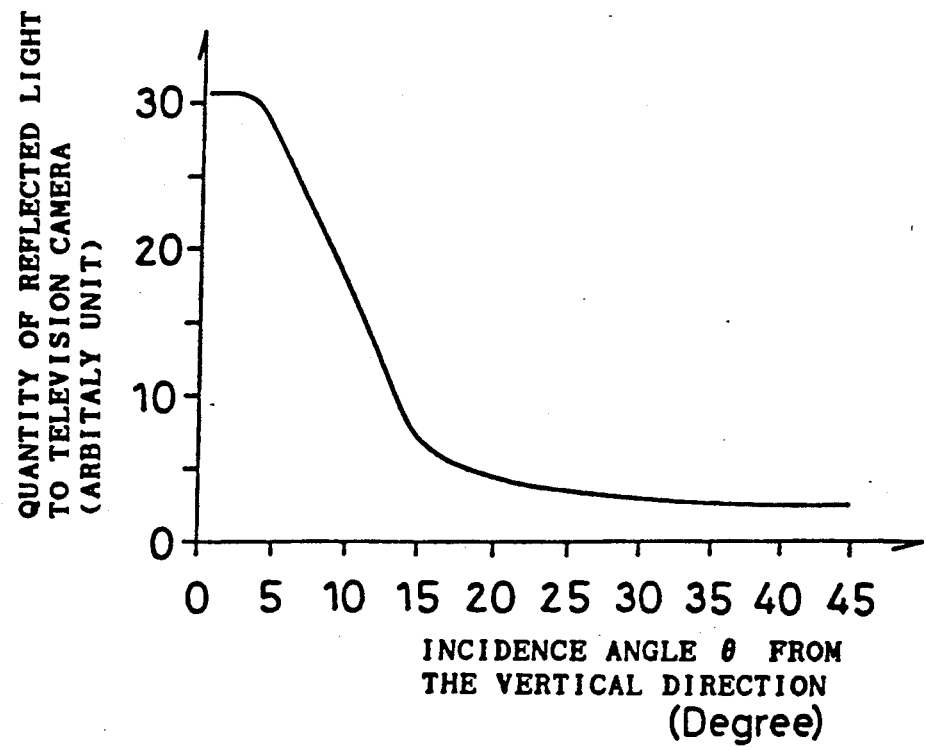
FIG. 17, FIG. 18 are characteristic diagrams of an embodiment.

FIG. 17 shows the relation between the incidence angle from the vertical direction to the marks 43, 44, and the quantity of reflected light to the television camera 94. At the incidence angle of 15 degrees or more, the quantity of reflected light to the television camera 94 decreases abruptly, and a sufficient quantity of reflected light is not obtained from the light source 98a. The quantity of reflected light reaches the maximum in irradiation from the vertical surface, and remains nearly constant until about less than 5 degrees, and drops slightly at 10 degrees. Accordingly, the incidence angle of the light entering from the vertical direction should be 10 degrees or less from the vertical direction, or preferably 5 degrees or less.

Figure 18:
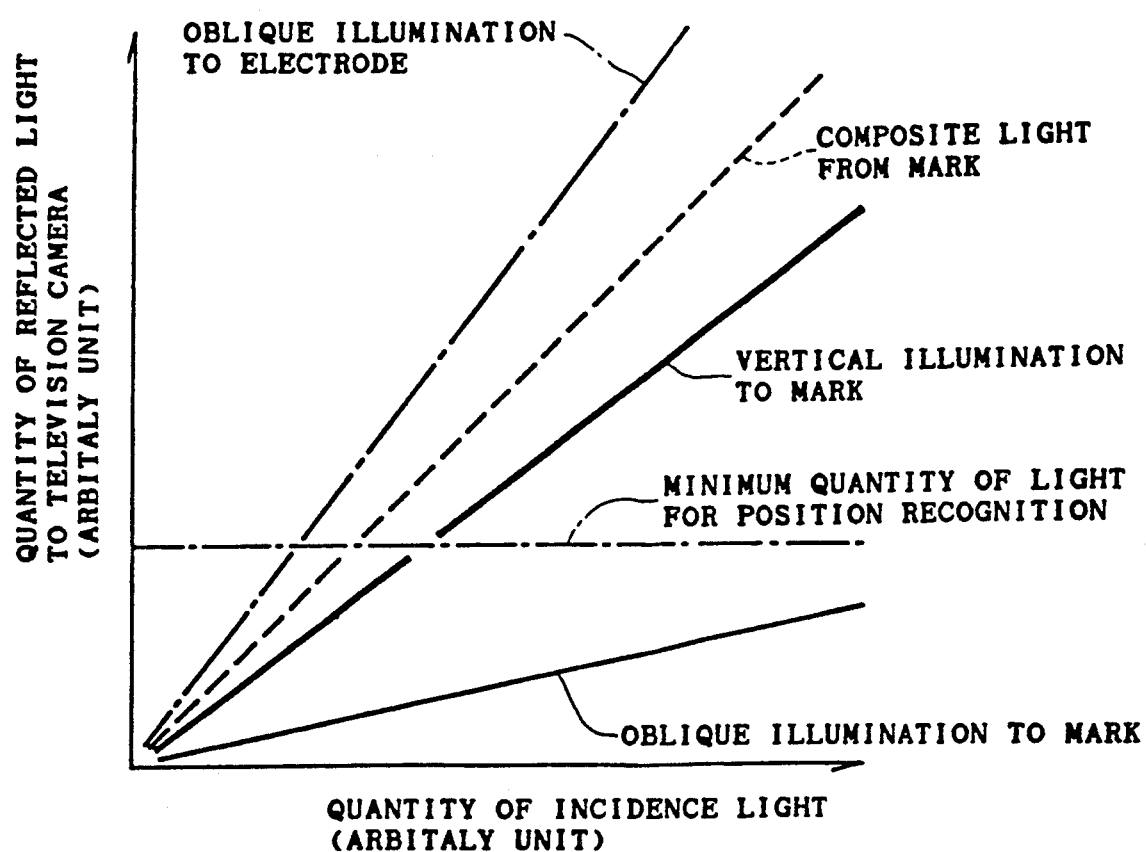

FIG. 18 shows the relation between the quantity of reflected light to the television camera 94 and the quantity of incident light to the mark 44. The horizontal chain line in the diagram indicates the minimum required quantity of light for position recognition at the position recognition means 86, the oblique illumination denotes the characteristic when illuminated from an oblique direction, and the vertical illumination shows the characteristic when the mark 44 illuminated from the vertical direction. The electrodes 1Q1, 1Q2, . . . are projecting from the surrounding insulation film 125 and are high in reflectivity, and therefore a sufficient reflected light is obtained even by the oblique illuminated light. However, the marks 43, 44 are low in reflectivity, and it is hard to recognize the position by oblique illumination. By contrast, in vertical illumination, the reflected light from the marks 43, 44 is intense, and the position can be recognized easily.

In the foregoing embodiments, meanwhile, mounting of arrays of light emitting diodes has been described, but the same holds true with mounting of arrays of photo transistors, photo diodes, photovoltaic cells, and others.

Figure 19:
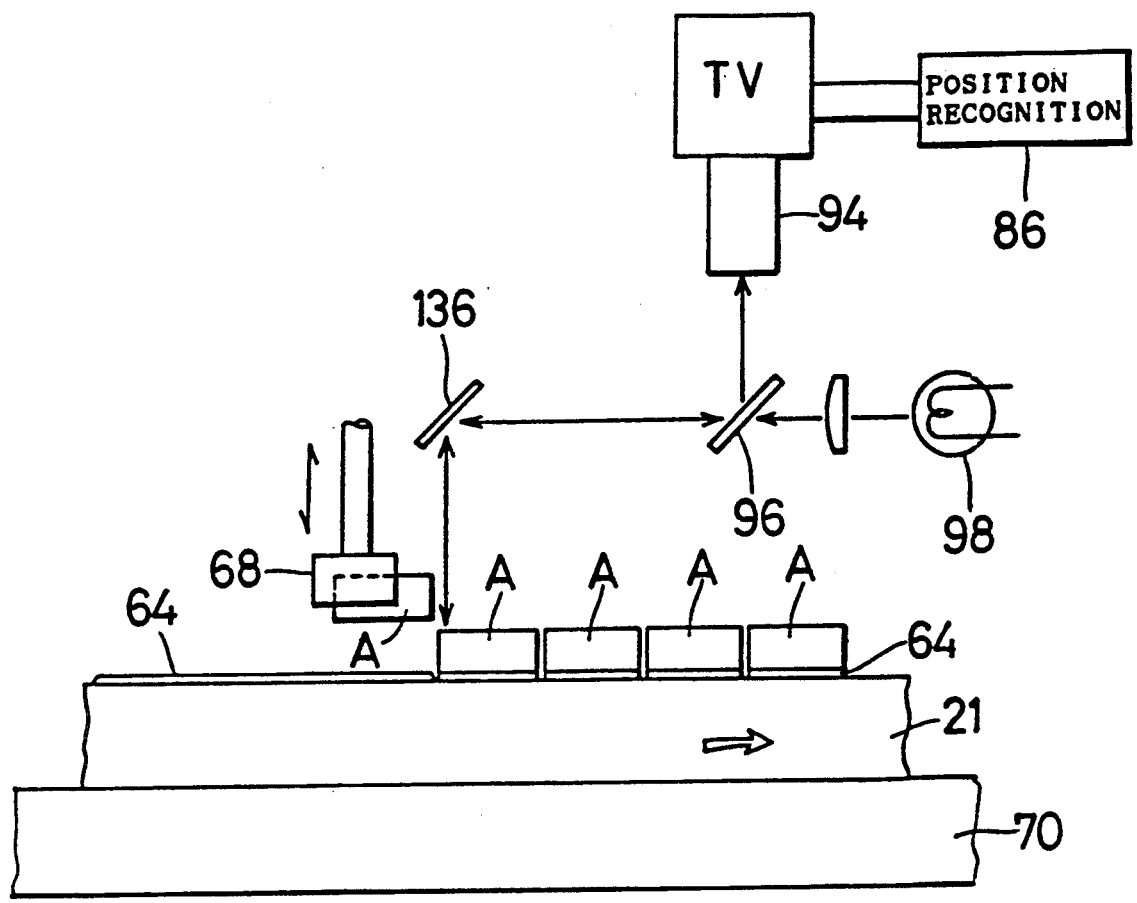
FIG. 19 is a front view of a second embodiment.
Figure 20:
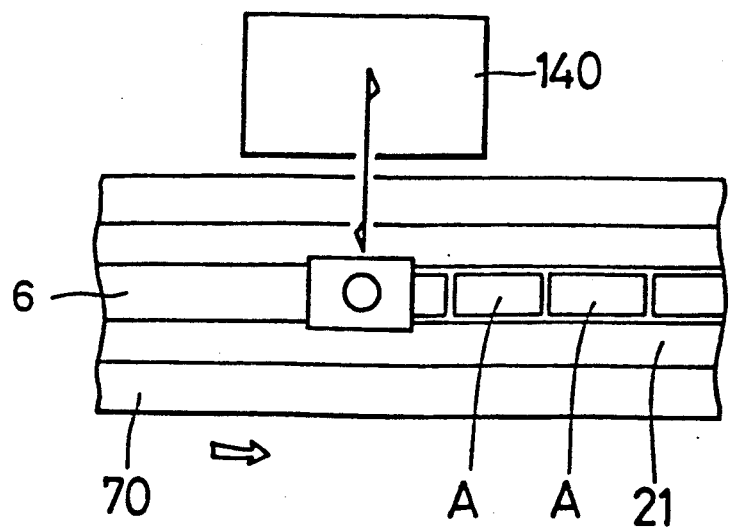
FIG. 20 is a plan view thereof.

FIG. 19 and FIG. 20 relate to a different embodiment in which evading motion of collet or the like is not necessary. The description relating to the first embodiment is also applied to this embodiment also unless otherwise specified.

In FIG. 19, numeral 68 is a collet, which picks up picture element arrays A one by one from a magazine of picture element arrays A located in the lateral direction (the nearer or further side in the drawing) of a substrate 21, and fixes the picture element arrays A on the substrate 21 by means of an adhesive layer 64. Numeral 138 is a mirror, which emits light of a light source 98 nearly vertically to a mark 43 of the picture element array A, and sends the reflected light to reflected light detecting means 94 through a half-mirror 96. When the mirror 136 is disposed at a higher position than the moving range of the broad portion of the bottom of the collet 68, the collet 68 and mirror 136 will not collide against each other. The mirror 136 and half-mirror 96 are included in an optical system, and the mirror 136 may be, for example, replaced by optical fibers or the like from above the picture element array A until before the half-mirror 96. Besides, the entire optical system may be composed of optical fibers, the half-mirror 96 may be replaced by optical connector, the light from the light source 98 may be fed into the optical fiber, and the reflected light may be delivered from the optical fiber into the position recognition means 94. Numeral 70 is a movable table, which sends the substrate 21 in the rightward direction in the drawing.

FIG. 20 shows a plan layout. Numeral 140 is a magazine of the picture element arrays A.

The operation of this embodiment is described below. The position of the mark 43 of the finally mounted picture element array A is detected by the position recognition means 94 by the reflected light of the light emitted almost vertically from the light source 98, through the half-mirror 96 and the mirror 136. In consequence, the deviation of the mark 43 from the reference position is detected, and the movable table 70 is moved according to this deviation, and the mounting position of the next picture element array A is determined. The collet 68 picks up the picture element arrays A one by one from the magazine 140, and mounts on the substrate 21. Here, since the position recognition means 94 is located at a position remote from the picture element array A, the collet 68 and position recognition means 94 do not interfere with each other. Accordingly, without having to evade the substrate 21 every time recognizing the position, mounting is enabled. After mounting, moreover, the positions of the marks 43, 44 are detected at almost same positions by the position recognition means 94, so that correct mounting of the picture element arrays A may be confirmed.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. At least one array of light emitting devices comprising:
   plural light emitting regions formed at constant intervals along a predetermined linear arranging direction, and
   reference regions possessing the same composition as the light emitting regions, and also having predetermined positions relative to the light emitting regions, the reference regions providing a basis for determining a distance between adjacent arrays of the light emitting devices.

2. At least one array of light emitting devices according to claim 1, further including connecting terminals connected to the light emitting regions, the connecting terminals being aligned and formed parallel to the linear arranging direction of the light emitting regions, and
   wherein the reference regions are shaped differently from the light emitting regions and connecting terminals and are formed at opposite ends of the linear arrangement of the light emitting regions and connecting terminals.

3. A device for printing in which plural arrays of light emitting devices are disposed adjacently,
   wherein each array comprises:
   plural light emitting regions formed at constant intervals along a predetermined linear arranging direction, and
   reference regions possessing the same composition as the light emitting regions, and having predetermined positions relative to the light emitting regions,
   in which the spacing between neighboring reference regions formed in adjacent arrays is determined so that an interval comprising the distance between a light emitting region formed at the end of one array and a neighboring light emitting region formed at the end of an adjacent array is equal to the constant intervals between adjacent light emitting regions on the same array.

4. At least one array of photo detectors comprising:
   plural light detecting regions formed at constant intervals along a predetermined linear arranging direction, and
   reference regions possessing the same composition as the light detecting regions, and also having predetermined positions relative to the light detecting regions, the reference regions providing a basis for determining a distance between adjacent arrays of the light detecting devices.

5. At least one array of photo detectors according to claim 4, further including connecting terminals connected to the light detecting regions, the connecting terminals being aligned and formed parallel to the linear arranging direction of the light detecting regions, and
   wherein the reference regions are shaped differently from the light detecting regions and connecting terminals and are formed at opposite ends of the linear arrangement of the light detecting regions and connecting terminals.

6. A device for reading in which plural arrays of photo detectors are disposed adjacently,
   wherein each array comprises:
   plural light detecting regions formed at constant intervals along a predetermined linear arranging direction, and
   reference regions possessing the same composition as the light detecting regions, and having predetermined positions relative to the light detecting regions,
   in which the spacing between neighboring reference regions formed in adjacent arrays is determined so that an interval comprising the distance between a light detecting region formed at the end of one array and a neighboring light detecting region formed at the end of an adjacent array is equal to the constant intervals between adjacent light detecting regions on the same array.

* * * * *